United States Patent
Saitoh (10) Patent No.: US 7,880,235 B2
(45) Date of Patent: Feb. 1, 2011

(54) SEMICONDUCTOR INTEGRATED CIRCUIT DEVICE

(75) Inventor: Naoto Saitoh, Chiba (JP)

(73) Assignee: Seiko Instruments Inc. (JP)

( * ) Notice: Subject to any disclaimer, the term of this patent is extended or adjusted under 35 U.S.C. 154(b) by 69 days.

(21) Appl. No.: 11/637,553

(22) Filed: Dec. 12, 2006

(65) Prior Publication Data

US 2007/0138558 A1    Jun. 21, 2007

(30) Foreign Application Priority Data

Dec. 13, 2005   (JP) .............................. 2005-358464

(51) Int. Cl.
*H01L 27/12* (2006.01)

(52) U.S. Cl. .................. 257/358; 257/350; 257/355; 257/356; 257/357; 257/359; 257/360; 257/E27.047

(58) Field of Classification Search ................. 257/347, 257/350, 340
See application file for complete search history.

(56) References Cited

U.S. PATENT DOCUMENTS

| | | | | |
|---|---|---|---|---|
| 3,649,886 A * | 3/1972 | Kooi | .................. | 257/638 |
| 3,714,525 A * | 1/1973 | Brown et al. | ................. | 257/388 |
| 4,302,764 A * | 11/1981 | Fang et al. | .................. | 365/184 |
| 4,870,860 A * | 10/1989 | Ohta et al. | ............... | 73/204.26 |
| 4,904,978 A * | 2/1990 | Barth et al. | .................... | 338/47 |
| 5,200,637 A * | 4/1993 | Matsuo et al. | .............. | 257/368 |
| 5,273,915 A * | 12/1993 | Hwang et al. | ................ | 438/155 |
| 5,554,873 A * | 9/1996 | Erdeljac et al. | ............. | 257/380 |
| 5,668,392 A * | 9/1997 | Huang et al. | ................ | 257/340 |
| 6,060,752 A * | 5/2000 | Williams | .................... | 257/355 |
| 6,090,648 A * | 7/2000 | Reedy et al. | ................ | 438/155 |
| 6,100,127 A * | 8/2000 | Wu | ............................ | 438/238 |
| 6,180,437 B1 * | 1/2001 | Moghe et al. | ............... | 438/128 |
| 6,232,142 B1 * | 5/2001 | Yasukawa | .................... | 438/69 |
| 6,469,351 B1 * | 10/2002 | Mimuro | ..................... | 257/355 |
| 6,483,170 B2 * | 11/2002 | Johansson | ................... | 257/580 |
| 6,611,028 B2 * | 8/2003 | Cheng et al. | ................ | 257/361 |
| 6,768,174 B2 * | 7/2004 | Hasegawa et al. | .......... | 257/350 |
| 6,826,030 B2 * | 11/2004 | Gorczyca et al. | ........... | 361/212 |
| 7,067,884 B2 * | 6/2006 | Okushima | ................... | 257/355 |
| 7,501,673 B2 * | 3/2009 | Park et al. | .................... | 257/288 |
| 2002/0055219 A1 * | 5/2002 | Randazzo | ................... | 438/231 |
| 2004/0026734 A1 * | 2/2004 | Clevenger et al. | .......... | 257/318 |
| 2006/0022274 A1 * | 2/2006 | Hasegawa et al. | .......... | 257/358 |
| 2006/0035421 A1 * | 2/2006 | Hasegawa | ................... | 438/155 |
| 2006/0176628 A1 * | 8/2006 | Hasegawa et al. | ............. | 361/56 |

FOREIGN PATENT DOCUMENTS

JP           08-181219      *   7/1996

* cited by examiner

*Primary Examiner*—Leonardo Andújar
*Assistant Examiner*—William Harriston
(74) *Attorney, Agent, or Firm*—Adams & Wilks (57) ABSTRACT

A semiconductor integrated circuit device has an SOI substrate comprising an insulating film laminated on a semiconductor support substrate and a semiconductor thin film laminated on the insulating film. A first N-channel MOS transistor, a first P-channel MOS transistor, and a resistor are each disposed on the semiconductor thin film. A second N-channel MOS transistor serving as an electrostatic discharge (ESD) protection element is disposed on a surface of the semiconductor support substrate that is exposed by removing a part of the semiconductor thin film and a part of the insulating film. The second N-channel MOS transistor has a gate electrode, a source region and a drain region surrounding the source region through the gate electrode to maintain a constant distance between the drain region and the source region.

17 Claims, 5 Drawing Sheets

PRIOR ART

SEMICONDUCTOR INTEGRATED CIRCUIT DEVICE

BACKGROUND OF THE INVENTION

1. Field of the Invention

The present invention relates to a semiconductor integrated circuit device having a structure for protecting a MOS transistor formed on a silicon-on-insulator (SOI) substrate from an overcurrent caused by static electricity or the like.

2. Description of the Related Art

In a semiconductor integrated circuit device including a resistor circuit composed of a resistor made of polysilicon or the like, an input or output protection element made of a diode or a MOS transistor is generally disposed between an internal circuit and an external input/output terminal to prevent breakdown of internal elements composing the internal circuit when an excess amount of current of a standard value or more flows into the circuit from outside by static electricity or the like.

Figure 2A:
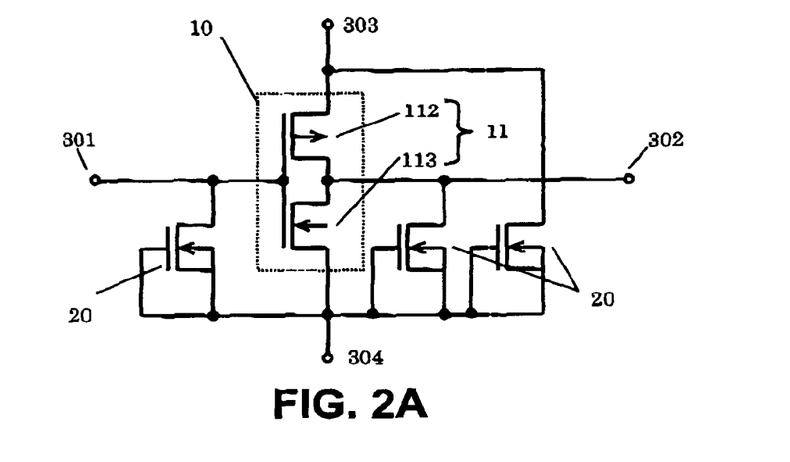
FIGS. 2A to 2C are circuit diagrams each showing an input/output circuit unit of the semiconductor integrated circuit device including a protection circuit.
Figure 2B:
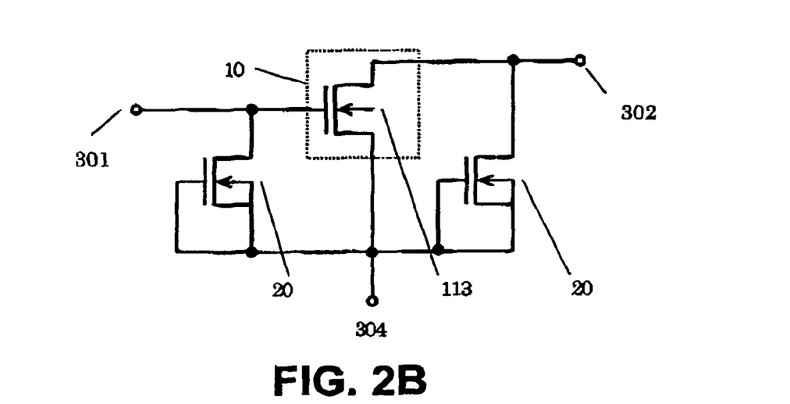
Figure 2C:
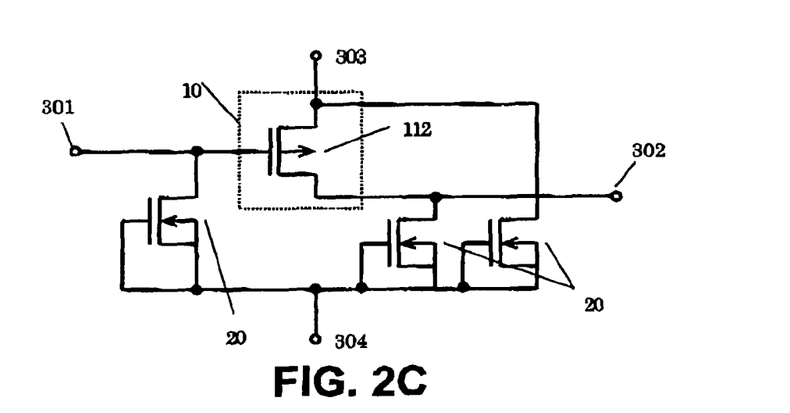

FIGS. 2A to 2C show examples of an input/output circuit unit in a conventional semiconductor integrated circuit device having such protection circuits. In FIG. 2A, a CMOS inverter 11 composed of an N-channel MOS transistor and a P-channel MOS transistor is illustrated as an internal element 10 of a CMOS structure. N-channel MOS transistors are provided as protection elements 20 between the CMOS inverter 11 and both an input terminal 301 and an output terminal 302, and between a Vdd line 303 and a Vss line 304. Note that the circuit configuration of the internal element is illustrated as the CMOS inverter 11 for ease of explanation.

With the above configuration, application of a negative overvoltage to the input or output terminal, for example, makes a forward voltage to attain at a PN junction of one of the NMOS transistors of the protection elements 20, causing a current flow in the protective NMOS transistor to protect the internal element. In contrast, when a positive overvoltage is applied, a current flows into the protective NMOS transistors by avalanche breakdown at the PN junction of the NMOS transistor in the protection elements 20. In this way, an overcurrent is directly guided to a grounded substrate by way of the input/output protection element and is thus kept from flowing in the internal element.

Input/output protection for the NMOS transistor 113 composing the internal element 10 shown in FIG. 2B and that for a PMOS transistor 112 composing the internal element 10 with a PMOS structure shown in FIG. 2C are directed to electrostatic discharge (ESD) protection in the same manner.

In general, a device element formed on an SOI substrate, particularly on a thin-film SOI substrate, is surrounded by a buried insulating film and an isolation insulating film, and thus exhibits poor heat dissipation performance and is likely to break down by heat generation due to an overcurrent. Therefore, an SOI device has a structure which is significantly vulnerable to ESD. When an ESD protection element is formed on the SOI semiconductor thin film to protect an inner circuit, the heat generation due to the overcurrent also causes the protection element to easily break down. In view of the above, various schemes have been implemented to obtain sufficient ESD strength.

For example, in a semiconductor integrated circuit device where a CMOS buffer ESD protection circuit is formed on an SOI substrate as an input protection element for an internal element, a PNP or NPN diode is additionally provided in front of the CMOS buffer ESD protection circuit to enhance the ESD strength (see JP 3447372 B (p. 6, FIG. 2), for example).

As mentioned above, the formation of the ESD protection element on the SOI substrate involves enlarging the protection element or increasing the number of protection elements for attaining a sufficient ESD strength, and is disadvantageous in that the protection circuit area and chip area are extended.

Meanwhile, as one way to attain the sufficient ESD strength, JP 04-345064 A (p. 9, FIG. 1) and JP 08-181219 A (p. 5, FIG. 1) disclose a semiconductor integrated circuit device in which an internal element 10 is formed in an SOI semiconductor thin film and an input protection element is formed on a semiconductor support substrate.

However, when the semiconductor thin film or buried insulating film of the SOI substrate is partially removed to expose the semiconductor support substrate and the protection element is formed on the exposed portion, the protection element itself can secure a sufficient ESD strength, but a problem arises in that the internal element cannot be sufficiently protected.

This is caused by the following mechanism. That is, in a general circuit design, an incoming ESD noise is supposed to get out through the ESD protection element in advance to the internal element. However, large withstand voltage of the ESD protection element on the semiconductor support substrate prevents the protection element from reacting to the ESD noise introduced from the output terminal 302, and the noise enters the internal element on the SOI semiconductor thin film, resulting in the breakdown of the internal element. Accordingly, the starting voltage of the ESD protection operation should be lower than the withstand voltage of the internal element while the ESD protection element on the semiconductor support substrate is designed to ensure sufficient breakdown strength.

SUMMARY OF THE INVENTION

The present invention has an object to provide a method of forming an ESD protection element capable of reducing a voltage of the ESD protection element at a start of an ESD protection operation to be lower than a withstand voltage of an internal element even in a case where the ESD protection element is formed on a semiconductor support substrate.

In order to solve the above-mentioned problem, the present invention employs the following means.

(1) There is provided a semiconductor integrated circuit device, including: a first N-channel MOS transistor disposed on a surface of a semiconductor thin film of an SOI substrate including an insulating film laminated on a semiconductor support substrate and the semiconductor thin film laminated on the insulating film; a first P-channel MOS transistor disposed on the surface of the semiconductor thin film; a resistor; and a second N-channel MOS transistor which is disposed so that a drain surrounds a source through a gate electrode with the drain and the source being separated by a constant distance, and serves as an ESD protection element disposed on a surface of the semiconductor support substrate which is a part of the SOT substrate and is exposed by removing the semiconductor thin film and a buried insulating film.

(2) in the semiconductor integrated circuit device, the source of the second N-channel MOS transistor serving as the ESD protection element has a circular configuration.

(3) In the semiconductor integrated circuit device, the source of the second N-channel MOS transistor serving as the ESD protection element has an elliptical configuration.

(4) In the semiconductor integrated circuit device, the source of the second N-channel MOS transistor serving as the ESD protection element has a polygonal configuration.

(5) In the semiconductor integrated circuit device, a gate electrode of the first N-channel MOS transistor has an N-type conductivity and a gate electrode of the first P-channel MOS transistor has a P-type conductivity.

(6) In the semiconductor integrated circuit device, an N-type gate electrode of the first N-channel MOS transistor, a P-type gate electrode of the first P-channel MOS transistor, and a gate electrode of the second N-channel MOS transistor serving as the ESD protection elements are formed of a first polysilicon.

(7) In the semiconductor integrated circuit device, an N-type gate electrode of the first N-channel MOS transistor, a P-type gate electrode of the first P-channel MOS transistor, and a P-type gate electrode of the second N-channel MOS transistor serving as the ESD protection element have a polycide structure as a laminate structure of a first polysilicon and refractory metal silicide.

(8) In the semiconductor integrated circuit device, the resistor is formed of a second polysilicon whose thickness is different from the first polysilicon forming the gate electrodes of the first N-channel MOS transistor and the first P-channel MOS transistor as the active elements, and the second N-channel MOS transistor as the ESD protection element.

(9) In the semiconductor integrated circuit device, the resistor is made of single-crystal silicon for the semiconductor thin film.

(10) In the semiconductor integrated circuit device, the resistor is a thin-film metal resistor made of an Ni—Cr alloy, chromium silicide, molybdenum silicide, β-ferrite silicide, or the like.

(11) In the semiconductor integrated circuit device, the semiconductor thin film forming the SOI substrate has a thickness of 0.05 µm to 0.2 µm.

(12) In the semiconductor integrated circuit device, the insulating film forming the SOI substrate has a thickness of 0.1 µm to 0.5 µm.

(13) In the semiconductor integrated circuit device, the insulating film forming the SOI substrate is made of an insulating material including glass, sapphire, or ceramics including a silicon oxide film or a silicon nitride film.

As described above, in the semiconductor integrated circuit device, the source region of the N-channel transistor as an internal element formed on the semiconductor thin film has a polygonal shape and opposes to only one side of the drain region which also has a polygonal shape, while the source region of the ESD input/output protection element having N-type MOS structure formed on the semiconductor support substrate is surrounded by the drain region, resulting easy control of bipolar operating voltage and low withstand voltage of the protection element against incoming ESD noise. Formation of the protection element on the support substrate ensures high ESD breakdown strength and first absorption of the ESD noise, and enables protection of an input/output terminal, particularly an output terminal, of the internal element on the semiconductor thin film which is vulnerable to the ESD noise.

In particular, a protection effect can be greatly exerted in a power management semiconductor integrated circuit device or analog semiconductor integrated circuit device in which electrical input/output characteristics are important.

DETAILED DESCRIPTION OF THE PREFERRED EMBODIMENTS

Figure 1A:
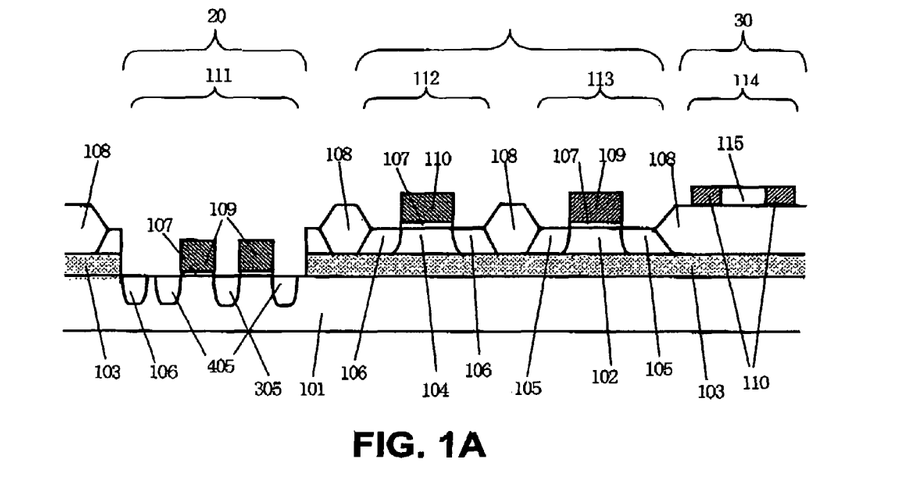
FIG. 1A is a schematic sectional diagram showing a semiconductor integrated circuit device according to an embodiment of the present invention.

Hereinafter, embodiments of the present invention will be described in detail with reference to the accompanying drawings. FIG. 1A is a schematic sectional diagram showing a semiconductor integrated circuit device according to an embodiment of the present invention.

A silicon-on-insulator (SOI) substrate is composed of, for example, a semiconductor support substrate 101 of a P-type conductivity, which is made of single crystal, a buried insulating film 103, and a semiconductor thin film 102 of a P-type conductivity, which is made of single crystal and is used to form elements. Formed on the P-type semiconductor thin film 102 are a CMOS inverter 11 as an internal element 10 composed of a first N-channel MOS transistor (hereinafter abbreviated to "NMOS") 113 and a first P-channel MOS transistor (hereinafter abbreviated to "PMOS") 112, and a P-type resistor 114 made of polysilicon as a resistor element 30. However, the internal element 10 is not limited to the CMOS inverter 11, and can be variously changed.

Further the semiconductor integrated circuit device has an electrostatic discharge (ESD) protective transistor 111 (hereinafter referred to as "protection NMOS transistor") composed of a second NMOS transistor as a protection element 20 formed on the semiconductor support substrate 101.

A thin-film SOI device, particularly a fully depleted (FD) SOI device, which is ideal for low-voltage operation or low power consumption, employs a so-called homopolar gate structure for CMOS transistors. This homopolar gate structure is such that an N-type polysilicon forms a gate electrode of the NMOS transistor 113, and P-type polysilicon forms a gate electrode of the PMOS transistor 112. The CMOS inverter 11 of this embodiment shown in FIGS. 1A and 1B has a similar structure as shown later. Hereinafter, description will be made on the SOI device of the FD structure by way of example. The polysilicon forming the gate of the transistor is defined as a first polysilicon.

To begin with, the NMOS transistor 113 is composed of an N-type impurity diffusion layer 105 serving as a source/drain region on the P-type semiconductor thin film 102, and a gate electrode made of the N-type polysilicon 109 formed on a gate insulating film 107 made of a silicon oxide film, for example. The PMOS transistor 112 is composed of a P-type impurity diffusion layer 106 serving as a source/drain region formed in an N-type well 104 formed in the P-type semiconductor thin film, and the gate electrode made of a P-type polysilicon 110 formed on the gate insulating film 107 made of, for example, silicon oxide film. The NMOS transistor 113 and the PMOS transistor 112 are completely isolated from each other by means of a field insulating film 108 formed through local oxidation of silicon (LOCOS) method, for example, and the buried insulating film 103.

In addition, the P-type resistor 114 of a high resistance constituting the resistor element 30 which is used for a bleeder voltage divider circuit as an analog circuit for dividing voltage, a CR circuit for setting a time constant, or the like is formed on the field insulating film, for example. In this embodiment, the P-type resistor is made of polysilicon.

Next, the protection NMOS transistor 111 constituting the protection element 20 is composed of a source 305, a drain 405, and a gate electrode. The source 305 is formed of an N-type impurity diffusion layer and provided in a circular configuration on the semiconductor support substrate 101, a part of which is exposed to air by removing a part of the semiconductor thin film 102 and the buried insulating film 103. The drain 405 is formed of an N-type impurity diffusion layer disposed so as to surround the source 305. The gate electrode is formed of the N-type polysilicon 109 provided on the gate insulating film 107 made of an oxide film or the like. The N-type polysilicon 109 is similar to the NMOS transistor 113 of the internal element. The gate electrode of the protection NMOS transistor 111 may be formed of P-type polysilicon unlike the NMOS transistor 113 of the internal element. Alternatively, the field insulating film 108 may be used for a region for isolating the source/drain regions.

Figure 8:
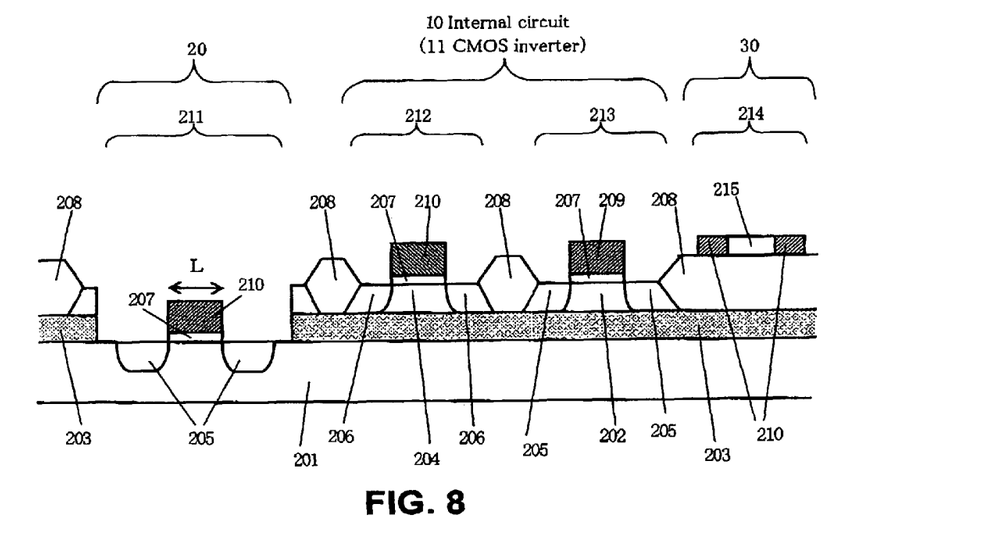
FIG. 8 is a schematic sectional diagram showing a conventional semiconductor integrated circuit device.

FIG. 8 shows a conventional structure, and the elements shown in FIG. 8 that are similar to those shown in FIG. 1 are denoted by the same reference numerals increased by 100. A protection NMOS transistor 211 is formed as the protection element. In general, a holding voltage of an NMOS transistor 213 of the internal element, which is the FD SOI device, tends to significantly reduce. Therefore, the NMOS transistor 213 of the internal element starts bipolar action at a lower voltage than that of the protection NMOS transistor 211 when a surge is applied from the outside, resulting in the breakdown of the internal element.

An increase in the length L of the protection NMOS transistor 211 to prevent the breakdown of the protection element also increases the holding voltage and the occupation area of the protection element.

In contrast, as in the embodiment of FIG. 1, use of the protection NMOS transistor 111 provided with the drain 405 which surrounds the source 305 and has a circular configuration for a protection element enables easy change of the holding voltage by adjusting the area of the source region (or a radius in the case of the circular configuration) to control current gain (hFE) for the bipolar action. To be specific, a small source area leads to a large current gain (hFE) and a low holding voltage. A large source area leads to a small current gain (hFE) and a high holding voltage. Accordingly, in order to prevent the breakdown of the internal element, the source area of the protection NMOS transistor 111 should be small, which reduces the entire area of the protection element.

A protection element having desired characteristics can be easily formed since the holding voltage can be further increased or reduced by adjusting the length L (i.e., base width in a bipolar transistor). It is also possible to expel the ESD noise first from the protection element through the bipolar action and not from the internal element formed of the FD SOI device.

Note that the P-type polysilicon 110 forming the P-type gate electrode contains acceptor impurities such as boron or $BF_2$ in a concentration of $1\times10^{18}$ atoms/cm$^3$ or higher. The N-type polysilicon 109 forming the N-type gate electrode contains donor impurities such as phosphorous or arsenic in a concentration of $1\times10^{18}$ atoms/cm$^3$ or higher.

The N-type impurity diffusion layers 105 as the source/drain region of the NMOS transistor 113 of the internal element 10 and the protection NMOS transistor 111 of the protection element 20 contain phosphorous or arsenic at a concentration of $1\times10^{19}$ atoms/cm$^3$ or higher. Alternatively, the N-type impurity diffusion layer 105 of the NMOS transistor 113 may be formed of arsenic, while the N-type impurity diffusion layer 305, 405 of the protection NMOS transistor 111 may be formed of phosphorous, and vise versa. The P-type impurity diffusion layer 106 as the source/drain region of the PMOS transistor 112 may be formed of boron or $BF_2$ at a concentration of $1\times10^{19}$ atoms/cm$^3$ or higher.

The thicknesses of the semiconductor thin film 102 and buried insulating film 103 of the SOI substrate are determined according to its operation voltage. The buried insulating film 103 is mainly made of a silicon oxide film with the thickness in a range of 0.1 μm to 0.5 μm. Note that the buried insulating film can be made of glass, sapphire, silicon nitride film, or the like. The function and performance of the fully depleted (FD) SOI device as a thin-film SOI device determine the thickness of the semiconductor thin film 102 to be in a range from 0.05 μm to 0.2 μm.

Further, in the embodiment of FIG. 1, the P-type resistor 114 of the resistor element 30 used in an analog circuit is made of a second polysilicon whose thickness is thinner than that of the gate electrode formed in a step different from the step of forming the gate electrodes of the CMOS inverter using the polysilicon 109 and polysilicon 110. For example, the thickness of the gate electrode is set to about 2,000 to 6,000 Å, while the thickness of the P-type resistor 114 is set to 500 to 2,500 Å. This is because a resistor formed of polysilicon with smaller thickness can have higher sheet resistance and better temperature characteristics for higher accuracy. The sheet resistance is set to several kΩ/□ to several tens of kΩ/□ in a general voltage divider circuit, although it varies depending on the application of the resistor. At this time, boron or $BF_2$ is doped as impurities in a concentration of about $1\times10^{14}$ atoms/cm$^3$ to $9\times10^{18}$ atoms/cm$^3$. FIG. 1 shows a P-type resistor 114 as an embodiment. Considering characteristics of resistors and specifications required for semiconductor products P-type low resistance resistors of high impurity concentration are used in some applications and N-type resistors of an inverse impurity polarity are used in other applications.

Note that the ESD strength can be enhanced by inserting the resistor element 30 between an input terminal 301 or output terminal 302 and the internal element 10 of FIGS. 2A to 2C.

Figure 1B:
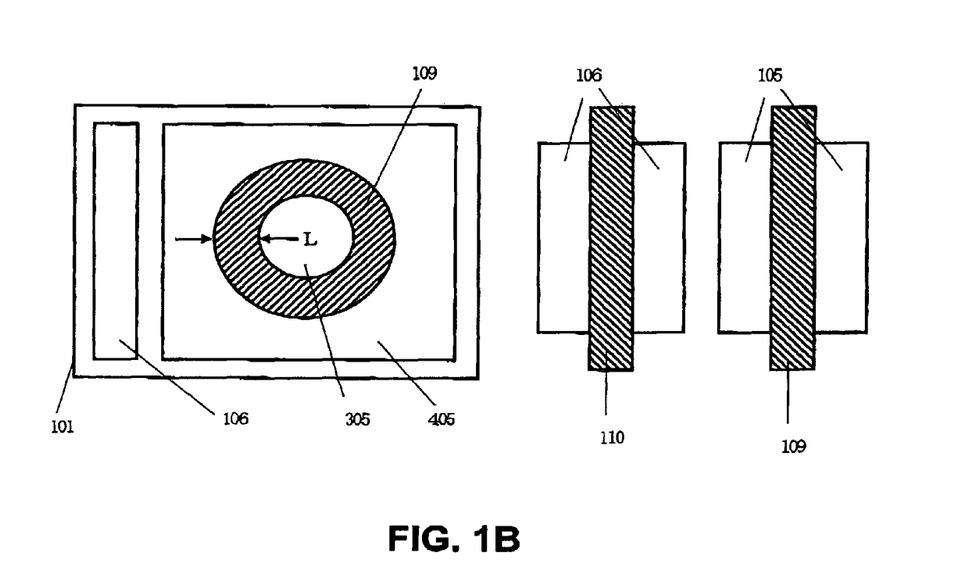
FIG. 1B is a schematic plan diagram showing a semiconductor integrated circuit device according to an embodiment of the present invention.

FIG. 1B is a schematic plan diagram of the semiconductor integrated circuit device shown in FIG. 1A according to the first embodiment. For ease of explanation, a resistor element is not shown in the drawing.

The NMOS transistor 113 and the PMOS transistor 112 of the internal element each include a source/drain region having a polygonal configuration (although the region is a rectangle in the drawing, polygonal configuration having more than four sides may be adopted). In general, a layout in which one side of the source region faces one side of the drain region is employed. On the other hand, the source 305 of the protection NMOS transistor 111 has a circular configuration and the drain 405 is formed so as to surround the source 305. In other words, the minimum distance between the source 305 and the drain 405 is kept constant. Note that the shape of the source 305 of the protection NMOS transistor 111 is not limited to the circular configuration. The source 305 may have an elliptical or polygonal configuration, but preferably have the circular configuration. In the case of the elliptical or polygonal configuration, the drain 405 is disposed to surround the source 305, and a layout in which the minimum distance between the periphery of the source 305 and the drain 405 is kept constant is adopted.

On a surface between the source 305 and the drain 405, the polysilicon 109 is provided through the gate insulating film, which is set as a mask in a case of performing impurity implantation into the source 305 and the drain 405. Thus, the distance between the source 305 and the drain 405 is determined through self-alignment, which can realize a highly accurate layout. Note that the polysilicon 109 is connected to the source 305 through a metal line, although now shown in the drawing. Further, N-type impurities such as phosphorous are introduced into the polysilicon 109, which causes the polysilicon 109 to be an N-type semiconductor having a high impurity concentration.

The P-type impurity diffusion layer 106 of a well electrode (i.e., base electrode in a bipolar transistor) is provided apart from the N-type drain 405 by a certain distance in the outer periphery of the drain 405. The distance between the drain 405 and the P-type impurity diffusion layer 106 of a base electrode is determined from consideration of characteristics thereof as a desired ESD protection transistor.

Figure 3:
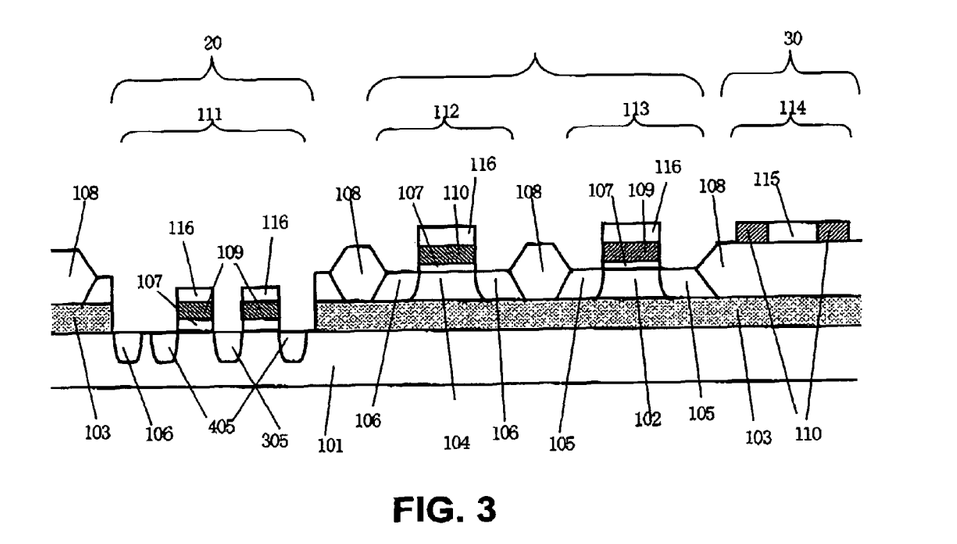
FIG. 3 is a schematic sectional diagram showing a semiconductor integrated circuit device according to another embodiment of the present invention.

FIG. 3 is a schematic sectional diagram showing a semiconductor integrated circuit device according to a second embodiment of the present invention.

In the first embodiment of the present invention shown in FIG. 1, a single layer of a general-purpose polysilicon is used for the gate electrode. In this case, particularly in a case of a single layer of a P-type polysilicon 110, a resistance thereof is as high as about 100Ω/□, and is not suitable for application in a semiconductor device in which high speed and high frequency operation is required. A structure shown in FIG. 3 is adopted to overcome the drawback. That is, the gate electrode is made to have a so-called polycide structure in which a refractory metal silicide 116 such as tungsten silicide, molybdenum silicide, titanium silicide, or platinum silicide is formed on the N-type polysilicon 109 and the P-type polysilicon 110 to have low resistance. The sheet resistance depends on the kinds of the refractory metal silicide and a thickness thereof, but is generally several Ω/□ to ten-odd Ω/□ in the thickness of 500 Å to 2,500 Å.

Since intrinsic operation of the MOS transistor is determined by the work function between the N-type and P-type polysilicons 109 and 110 and the semiconductor thin film, the performance of the semiconductor device is improved to such an extent that the resistance of the gate electrode is reduced.

Hereinafter, FIGS. 4 to 7 each show a structure of a semiconductor integrated circuit device according to another embodiment.

Figure 4:
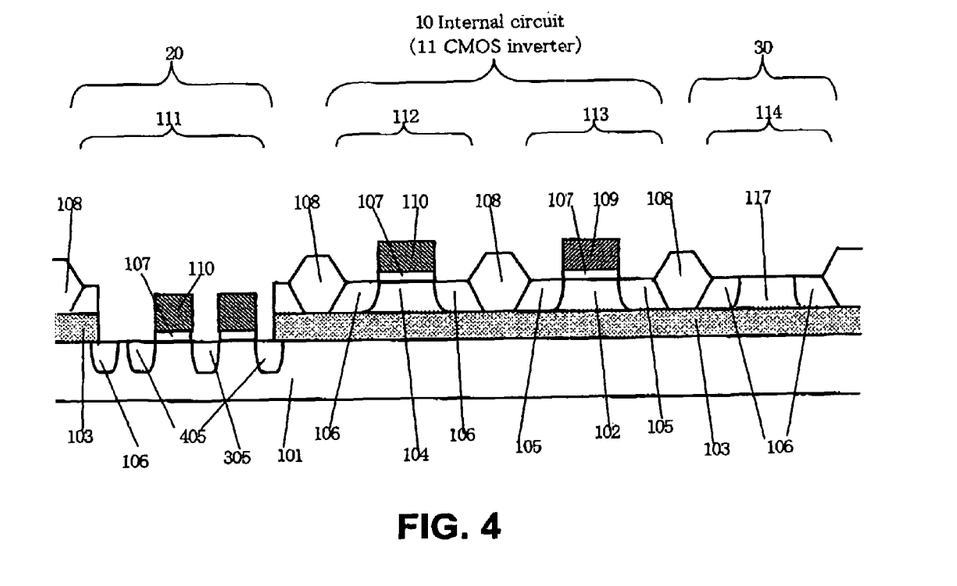
FIG. 4 is a schematic sectional diagram showing a semiconductor integrated circuit device according to another embodiment of the present invention.

FIG. 4 is a schematic sectional diagram showing a modified example of the semiconductor integrated circuit device of the present invention shown in FIG. 1.

The structure illustrated in FIG. 4 also includes the CMOS inverter 11 as the internal element, the protection element 20 made of the protection NMOS transistor 111 aiming at ESD protection for input/output terminals of the internal element, and the resistor element 30 used in the analog circuit, which are the basic components of the present invention, but differs from that of FIG. 1 in that the resistor element 30, for example, the P-type resistor 114 is formed of single-crystal silicon of the semiconductor thin film 117 instead of the polysilicon.

Need for accurate division of voltage by bleeder voltage divider circuit in analog circuit requires high accuracy in resistance ratio as the characteristics for bleeder resistors. For example, with a voltage detector (hereinafter, referred to as "VD") or the like, a resistor circuit 30 occupies a very large area relative to the entire chip area. Thus, reduction in the area for the resistor element while keeping the accuracy leads to reduction in the chip area, enabling cost reduction.

When the resistor is formed using the semiconductor thin film of the SOI substrate as the single-crystal silicon, no crystal grain boundary exists in the resistor, the resistor is completely free of a resistance variation dependent on the grain boundary, and it is possible to increase a resistance of the resistor and reduce an area of the resistor at the same time. Use of such resistor is very effective.

Note that the semiconductor integrated circuit device according to the embodiment of the present invention shown in FIG. 4 has the same function and effect as the semiconductor integrated circuit device of FIG. 1.

Figure 5:
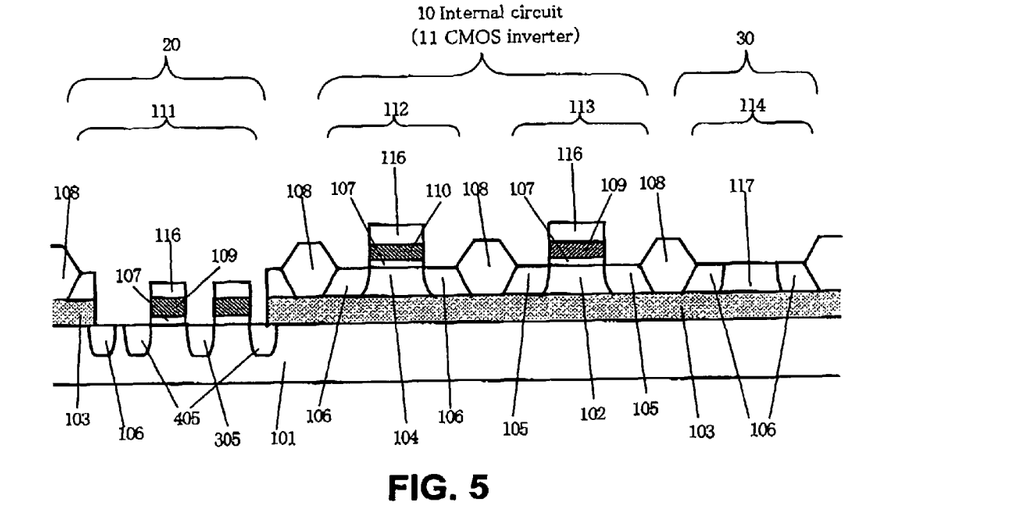
FIG. 5 is a schematic sectional diagram showing a semiconductor integrated circuit device according to another embodiment of the present invention.

FIG. 5 is a schematic sectional diagram showing a modified example of the semiconductor integrated circuit device according to the embodiment of the present invention shown in FIG. 3. This structure is similar to that of FIG. 4 in that the resistor element 30, for example, the P-type resistor 114 is formed of single-crystal silicon of the semiconductor thin film instead of polysilicon. Note that the semiconductor integrated circuit device as shown in FIG. 5 has the same function and effect as the semiconductor integrated circuit device of FIG. 3 and the same advantages as the resistor formed of single-crystal silicon shown in FIG. 4.

Figure 6:
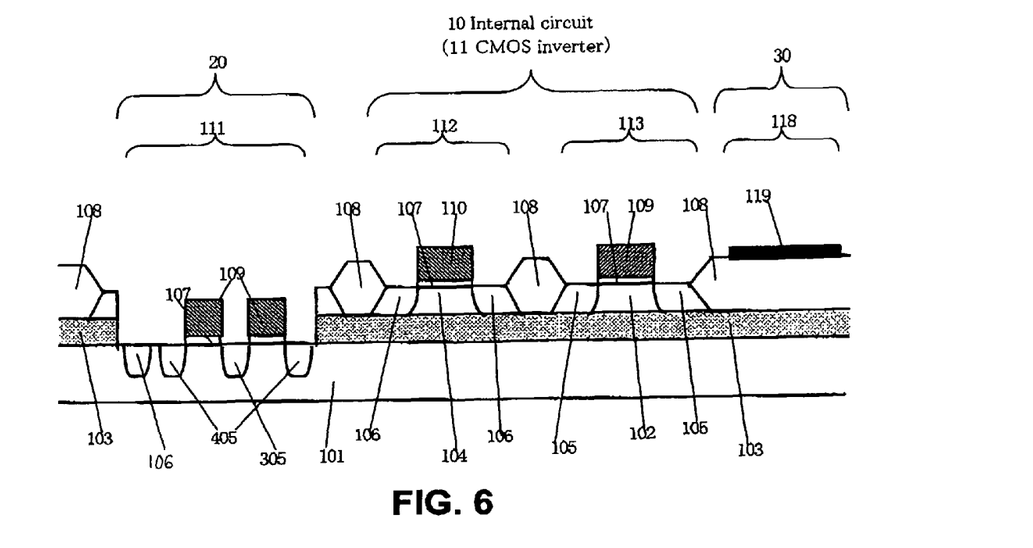
FIG. 6 is a schematic sectional diagram showing a semiconductor integrated circuit device according to another embodiment of the present invention.

FIG. 6 is a schematic sectional diagram showing another modified example of the semiconductor integrated circuit device according to the embodiment of the present invention shown in FIG. 1.

The structure illustrated in FIG. 6 also includes the CMOS inverter 11 as the internal element, the protection element 20 made of the P+ gate protection NMOS transistor 111 aiming at ESD protection for input/output terminals of the internal element, and the resistor element 30 used in the analog circuit, which are the basic components of the present invention, but differs from that of FIG. 1 in that a thin-film metal resistor 118 is used as the resistor element 30 instead of the polysilicon.

In the embodiment shown in FIG. 6, a chromium silicide 119 is used as the thin-film metal resistor 118, but a Ni—Cr alloy or a metal silicide such as molybdenum silicide or β-ferrite silicide can be used. The chromium silicide is high in resistance among metal silicides, and thus can be used as a resistor by being deposited into a film as thin as about 100 Å to 300 Å. The thin-film metal resistor 118 is used in place of the polysilicon, whereby variations in precision ratio and resistance of the voltage divider circuit, and temperature coefficients can be reduced. Note that the semiconductor integrated circuit device according to the embodiment of the present invention as shown in FIG. 6 has the same function and effect as the semiconductor integrated circuit device of FIG. 1.

Figure 7:
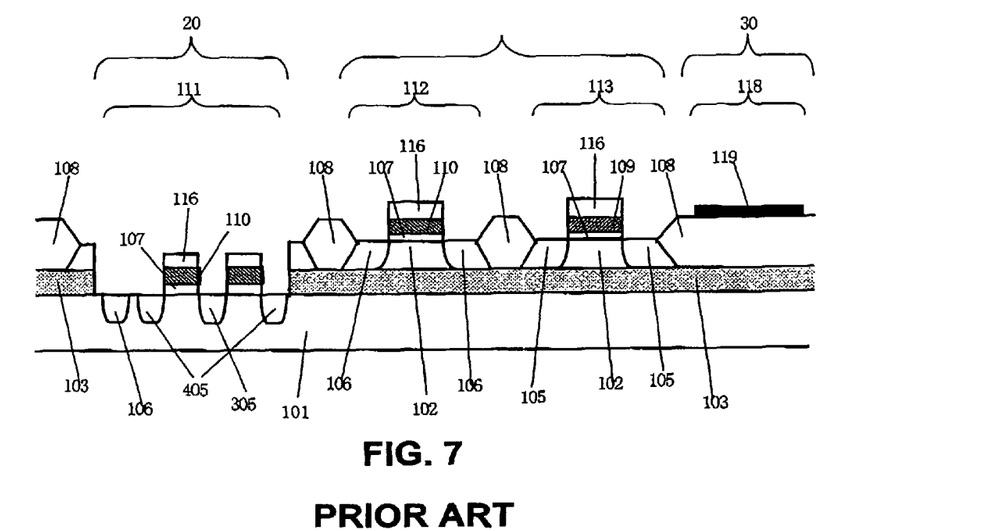
FIG. 7 is a schematic sectional diagram showing a semiconductor integrated circuit device according to another embodiment of the present invention.

FIG. 7 is a schematic sectional diagram showing still another modified example of the semiconductor integrated circuit device according to the embodiment of the present invention shown in FIG. 3. This structure is similar to that of FIG. 6 in that the thin-film metal resistor 118 is used as the resistor element 30 instead of polysilicon. Note that the semiconductor integrated circuit device as shown in FIG. 6 has the same function and effect as the semiconductor integrated circuit device of FIG. 3 and the same advantages as the resistor formed of thin-film metal shown in FIG. 5.

The embodiment modes of the present invention have been described by way of embodiments employing the SOI substrate made of the P-type semiconductor support substrate and the P-type semiconductor thin film. However, an SOI substrate composed of an N-type semiconductor support substrate and an N-type semiconductor thin film may be used. At this time, it is possible to set the withstand voltage for the ESD protection operation to be lower than the withstand voltage for the internal element of the thin-film SOI device while securing the high ESD breakdown strength, and dissipate the ESD noise first from the internal element according to the above-mentioned example or principles for a protection NMOS transistor including an N-type substrate, a P-type well, and a P+ gate, and formed on the N-type semiconductor support substrate.

In addition, examples of the SOI substrate include a bonded SOI substrate manufactured by bonding the semiconductor thin films forming an element, and a SIMOX substrate manufactured by implanting oxygen ions into a semiconductor substrate, followed by heat treatment to form a buried oxide film, both of which can be used in the present invention. Further, in the case of using the bonded SOI substrate, the polarities of the semiconductor thin film and the semiconductor substrate may be different in conductivity.

What is claimed is:

1. A semiconductor integrated circuit device, comprising:
an SOI substrate comprising an insulating film laminated on a semiconductor support substrate and a semiconductor thin film laminated on the insulating film;
a first N-channel MOS transistor disposed on a surface of the semiconductor thin film;
a first P-channel MOS transistor disposed on the surface of the semiconductor thin film, the first P-channel MOS transistor being isolated from the first N-channel MOS transistor by a field insulating film;
a resistor formed on the field insulating film, the resistor and the semiconductor thin film being formed of single-crystal silicon; and
a second N-channel MOS transistor serving as an electrostatic discharge (ESD) protection element disposed on a surface of the semiconductor support substrate that is exposed by removing a part of the semiconductor thin film and a part of the insulating film, the second N-channel MOS transistor having a gate electrode, a source region, a drain region surrounding the source region through the gate electrode to maintain a constant distance between the drain region and the source region, and an impurity diffusion layer disposed in an outer periphery of the drain region and spaced apart a preselected distance from the drain region.

2. A semiconductor integrated circuit device according to claim 1; wherein the source of the second N-channel MOS transistor has a circular configuration.

3. A semiconductor integrated circuit device according to claim 1; wherein the source of the second N-channel MOS transistor has an elliptical configuration.

4. A semiconductor integrated circuit device according to claim 1; wherein the source of the second N-channel MOS transistor has a polygonal configuration.

5. A semiconductor integrated circuit device according to claim wherein 1; wherein a gate electrode of the first N-channel MOS transistor has an N-type conductivity and a gate electrode of the first P-channel MOS transistor has a P-type conductivity.

6. A semiconductor integrated circuit device according to claim 5; wherein each of the N-type gate electrode of the first N-channel MOS transistor, the P-type gate electrode of the first P-channel MOS transistor, and the gate electrode of the second N-channel MOS transistor is formed of a first polysilicon.

7. A semiconductor integrated circuit device according to claim 5; wherein each of the N-type gate electrode of the first N-channel MOS transistor, the P-type gate electrode of the first P-channel MOS transistor, and the gate electrode of the second N-channel MOS transistor has a laminate polycide structure of polysilicon and a refractory metal silicide.

8. A semiconductor integrated circuit device according to claim 1; wherein the semiconductor thin film forming the SOI substrate has a thickness in the range of 0.05 µm to 0.2 µm.

9. A semiconductor integrated circuit device according to claim 1; wherein the insulating film forming the SOI substrate has a thickness in the range of 0.1 µm to 0.5 µm.

10. A semiconductor integrated circuit device according to claim 1; wherein the insulating film forming the SOI substrate is made of an insulating material including glass, sapphire, and ceramics including a silicon oxide film and a silicon nitride film.

11. A semiconductor integrated circuit device comprising:
a semiconductor support substrate;
an insulating film disposed on the semiconductor support substrate;
a semiconductor thin film disposed on the insulating film;
a first N-channel MOS transistor and a P-channel MOS transistor disposed on the semiconductor thin film and isolated from each other by a field insulating film, and a resistor disposed on the field insulating film, the resistor and the semiconductor thin film being formed of single-crystal silicon; and
an electrostatic discharge (ESD) protection element having a second N-channel MOS transistor disposed on the semiconductor support substrate, the second N-channel MOS transistor having a gate electrode, a source region and a drain region surrounding the source region through the gate electrode so as to maintain a constant distance between the drain region and the source region in order to obtain a preselected holding voltage of the first N-channel MOS transistor that prevents a bipolar action of the first N-channel MOS transistor from occurring at a lower voltage than that of the second N-channel MOS transistor, and an impurity diffusion layer disposed in an outer periphery of the drain region and spaced apart a preselected distance from the drain region.

12. A semiconductor integrated circuit device according to claim 11; wherein the source of the second N-channel MOS transistor has one of a circular-, elliptical-, and polygonal-shaped configuration.

13. A semiconductor integrated circuit device according to claim 11; wherein a gate electrode of each of the first N-channel MOS transistor and the P-channel MOS transistor and the gate electrode of the second N-channel MOS transistor is formed of a first polysilicon; and wherein the resistor is formed of a second polysilicon having a thickness different from that of the first polysilicon.

14. A semiconductor integrated circuit device according to claim 11; wherein a gate electrode of each of the first N-channel MOS transistor and the P-channel MOS transistor and the gate electrode of the second N-channel MOS transistor has a laminate polycide structure of polysilicon and a refractory metal silicide.

15. A semiconductor integrated circuit device comprising:

an SOI substrate having a semiconductor support substrate, an insulating film disposed on the semiconductor support substrate, and a semiconductor thin film disposed on the insulating film;

an internal circuit element having a first N-channel MOS transistor and a P-channel MOS transistor each formed on the semiconductor thin film and isolated from each other by a field insulating film;

a resistor element formed on the field insulating film, the resistor and made of single-crystal silicon comprising the semiconductor thin film being formed of single-crystal silicon; and an electrostatic discharge (ESD) protection element that performs an ESD protection operation and is formed on the semiconductor substrate, the ESD protection element having a second N-channel MOS transistor including a source region, a drain region surrounding the source region so that a voltage of the ESD protection element at a start of an ESD protection operation is controlled to a voltage lower than a withstand voltage of the internal circuit element, and an impurity diffusion layer disposed in an outer periphery of the drain region and spaced apart a preselected distance from the drain region.

16. A semiconductor integrated circuit device according to claim 15; wherein the drain region surrounds the source region so as to maintain a constant distance between the drain region and the source region.

17. A semiconductor integrated circuit device according to claim 15; wherein the source of the second N-channel MOS transistor has one of a circular-, elliptical-, and polygonal-shaped configuration.

\* \* \* \* \*